United States Patent [19]

Mathis

[11] Patent Number: 4,646,085
[45] Date of Patent: Feb. 24, 1987

[54] SHAFT POSITION ENCODER APPARATUS WITH LOGIC AND DECODER

[75] Inventor: Henry L. Mathis, Aloha, Oreg.

[73] Assignee: Leupold & Stevens, Inc., Beaverton, Oreg.

[21] Appl. No.: 761,778

[22] Filed: Aug. 2, 1985

[51] Int. Cl.$^4$ .............................................. G08C 19/16
[52] U.S. Cl. ......................... 340/870.19; 340/347 M; 340/672
[58] Field of Search ............. 340/870.19, 672, 870.11, 340/347 M, 870.20, 870.16, 820.21; 375/26

[56] References Cited

U.S. PATENT DOCUMENTS

| | | | |
|---|---|---|---|
| 4,313,114 | 1/1982 | Lee et al. ..................... | 340/870.23 |
| 4,331,917 | 5/1982 | Render et al. .................. | 340/672 X |

Primary Examiner—Jerry W. Myracle
Attorney, Agent, or Firm—Klarquist, Sparkman, Campbell, Leigh & Whinston

[57] ABSTRACT

A smart shaft position encoder apparatus is described which can be used for measuring changes in liquid levels. The apparatus employs dedicated logic and decoder circuitry for converting the raw shaft sensor data into instrumentation-compatible format. The raw shaft sensor data is generated by a shaft pulse generator which provides a pulse for each discrete change in shaft position. The sequence of pulses indicates whether shaft rotation is in a clockwise or counterclockwise direction. A preferred shaft pulse generator includes three reed switches which are operated by four permanent magnets mounted on a support disk which rotates in accordance with the position of the shaft, such shaft being coupled to a float pulley when used as a liquid level recorder. A rotation position detector is coupled to the shaft interface and produces output pulses in response to the raw shaft position data from the shaft interface. Connected to the output of the rotation position detector is a rotation direction sensor, which produces an output signal indicative of the direction of shaft rotation. Also coupled to the output of the rotation position detector is a rotation detector for generating output pulses corresponding to true movements of shaft rotation. Logic circuitry combines the direction-of-rotation information provided by the rotation direction sensor and the unit-of-rotation information provided by the rotation detector to produce one of two output signals indicative of an incremental shaft rotation in a clockwise or counterclockwise direction. The logic circuitry is designed to produce output pulses compatible with existing data-recording equipment.

16 Claims, 3 Drawing Figures

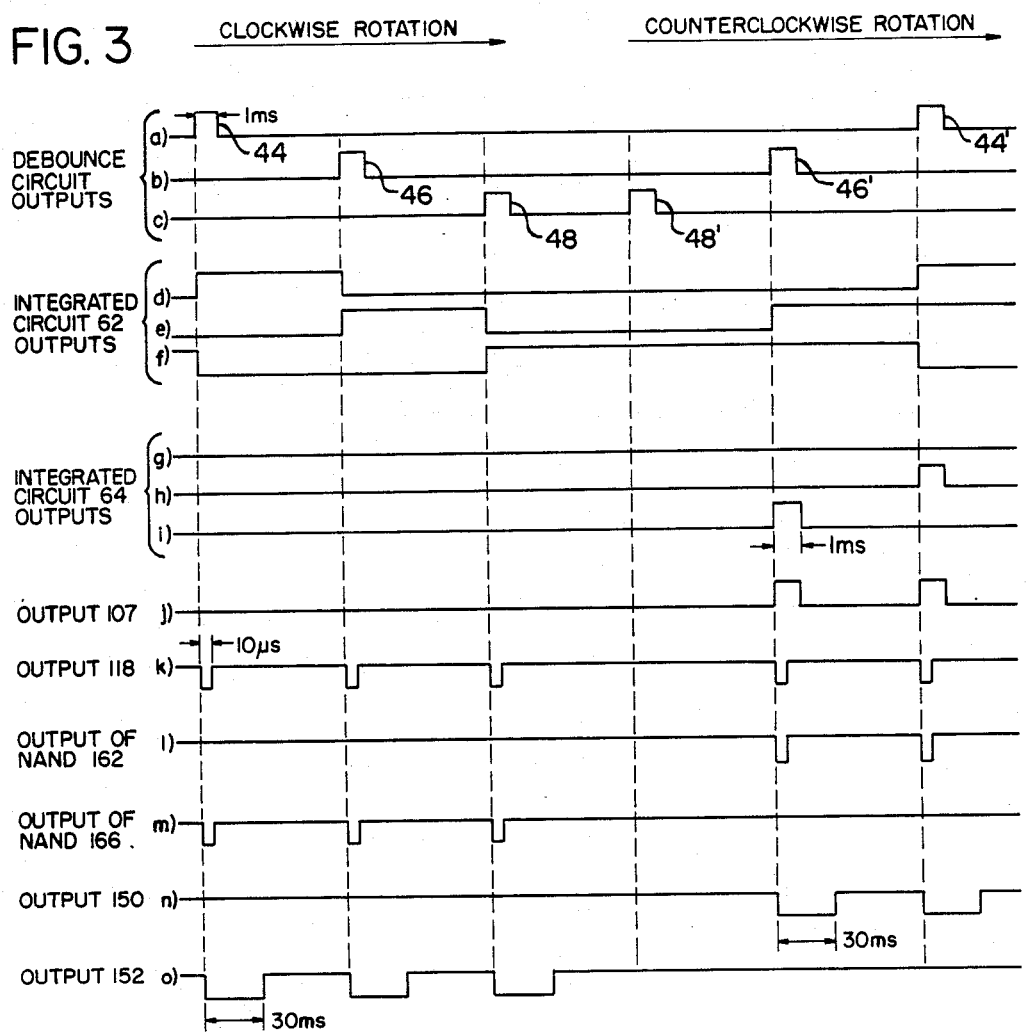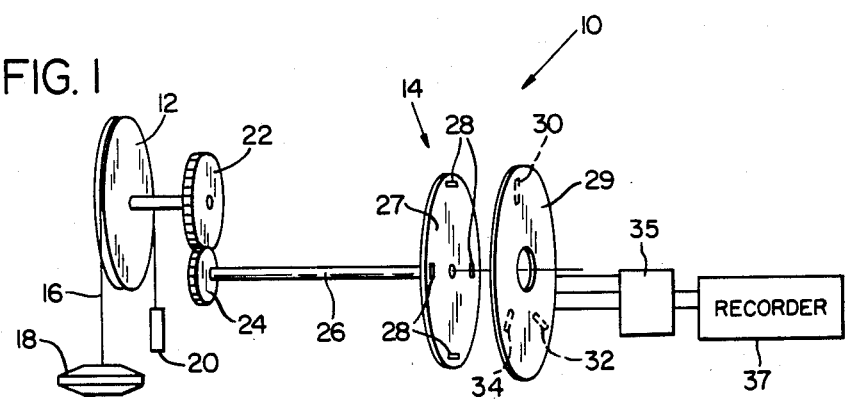

SHAFT POSITION ENCODER APPARATUS WITH LOGIC AND DECODER

BACKGROUND OF THE INVENTION

The present invention reltaes generally to shaft position encoders, and in particular to smart shaft position encoders that contain dedicated logic and decoder circuits for converting raw sensor data into instrumentation-compatible format. The shaft position encoder apparatus of the present invention is especially useful for recording changes in liquid levels, such as river or reservoir levels, and indicating whether the change is up or down from the previous level. The system produces a processed electrical pulse signal for each discrete rise or fall in liquid level. As a result of signaling only increases or decreases exceeding a predetermined discrete amount, the shaft position encoder of the present invention has a low-duty cycle and normally draws only a small value of standby current. The particular implementation of the circuit obviates the need for a microprocessor and associated memory for storing liquid level signals.

Previously, it has been proposed in U.S. Pat. No. 4,313,114 of Lee et al., to provide a liquid level recording system including a shaft encoder pulse generator which transmits a group of electrical pulses for each measure change in shaft position or liquid level. The sequence of pulses in each group indicates whether the change is an increase or decrease from the previous reading. The system employs a microprocessor to measure the shaft position and direction of rotation and uses a temporary memory to store a difference signal corresponding to changes in the shaft position. This difference signal is periodically gated into a permanent memory if it exceeds a predetermined magnitude, or "deadband." Unlike the shaft position encoder of the present invention, this prior apparatus employs a periodically gated memory for storing the difference signal corresponding to the difference between successively measured liquid levels. It also provides slower tracking of shaft positon and consumes more power than the present invention. Further, this prior art recording apparatus is intolerant to wide swings in the power supply voltage. Lastly, the Lee et al. apparatus uses a microprocessor-based system external to the pulse generator to provide the logic and decoding functions necessary to interface with standard instrumentation equipment, rather than providing these functions internally.

SUMMARY OF THE INVENTION

It is therefore one object of the present invention to overcome the disadvantages of the above-described prior art and to provide an improved shaft position encoder apparatus.

Another object of the present invention is to provide a smart shaft position encoder apparatus having internal logic and decoder functions to determine the amount and direction of rotation of the shaft.

A further object of the invention is to provide such a shaft position encoder apparatus operable over a wide range of temperatures and power supply voltages.

An additional object of the present invention is to provide a shaft position encoder apparatus for a liquid level recorder, that provides rapid tracking of shaft position.

Still another object is to provide such a shaft position encoder apparatus which readily interfaces with existing fluid measurement equipment.

A still further object of the invention is to provide a shaft position encoder apparatus having debounce circuits for each of the fluid level detector switches to eliminate the effect of switch contact bounce on the output signal.

Another object of the present invention is to provide a shaft position encoder apparatus with a sequential comparator circuit for comparing sequences of pulses to determine whether a rotation of the shaft has occurred.

DRAWINGS

Other objects and advantages of the present invention will be apparent from the following detailed description of the preferred embodiments thereof and from the attached drawings of which:

FIG. 1 is a diagrammatic view of one embodiment of a shaft position encoder apparatus of the present invention used as a liquid level recorder;

FIG. 3 is a diagrammatic view showing various electrical signals produced by the pulse processing circuit of FIG. 2.

DESCRIPTION OF PREFERRED EMBODIMENT

Pulse Generator

Figure 2:
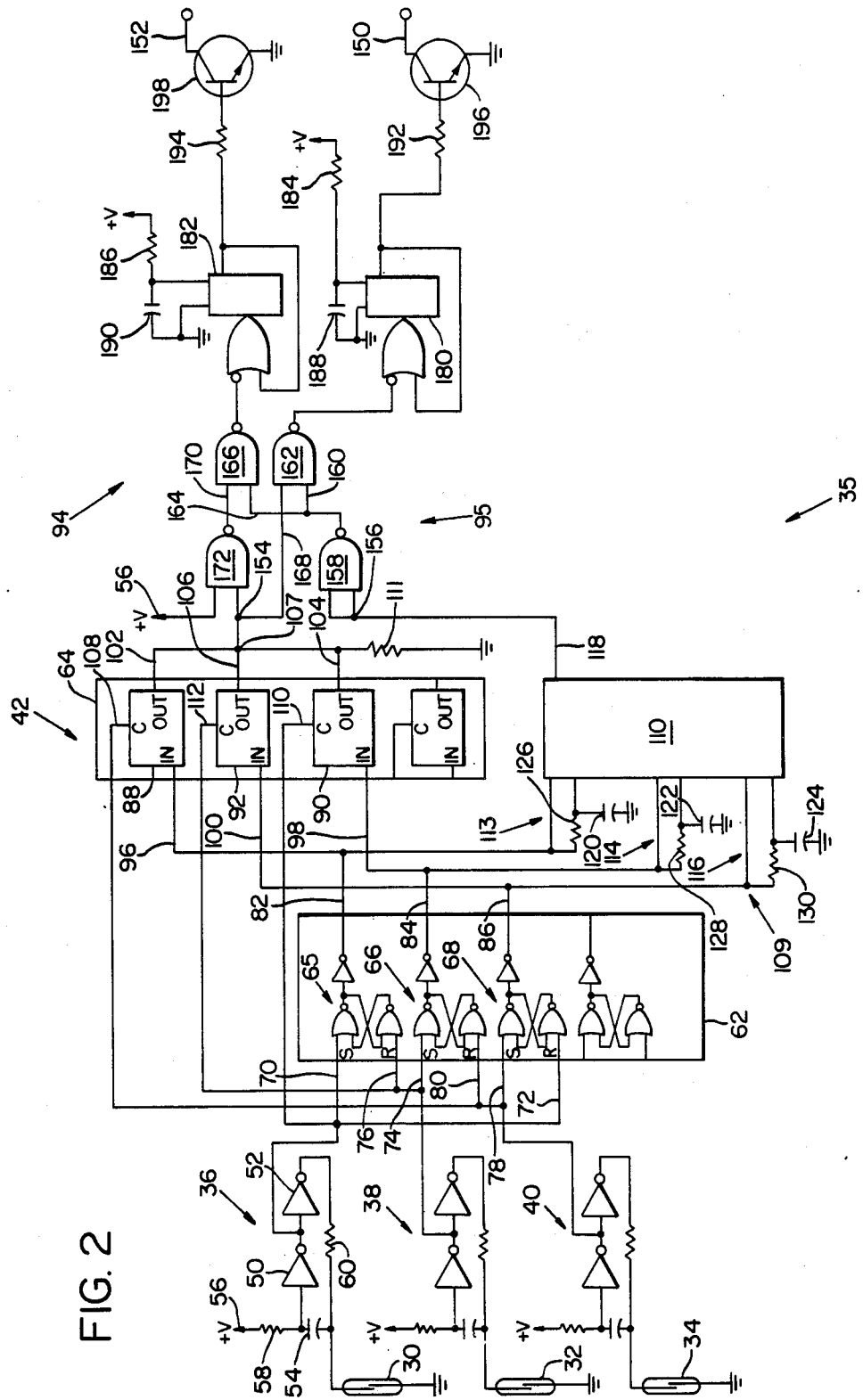
FIG. 2 is a schematic diagram of the pulse processing circuit of a shaft position encoder apparatus of FIG. 1.

As shown in FIG. 1, a shaft position encoder apparatus 10 according to the present invention may be used in a liquid level recorder which employs a float pulley 12 to rotate the shaft of a shaft pulse generator 14. The shaft pulse generator includes a plurality of pulse sources which produce a group of encoder pulses 30, 32 and 34 for each measured change in the revolution of the shaft. The sequence of pulses corresponds to the shaft's direction of rotation.

Float pulley 12 is rotated by a line 16 attached at one end to a float 18 and at the other end to a counter weight 20. The float moves with the liquid level and rotates the pulley. The shaft of the float pulley 12 is connected by gears 22 and 24 to the shaft 26 of shaft pulse generator 14.

Shaft pulse generator 14 includes a first, rotatable disk 27 connected to shaft 26 and having four permanent magnets 28 mounted at positions spaced equally about the circumference of such disk. The pulse generator further includes a second, stationary disk 29, spaced apart from rotatable disk 27, having three reed switch pulse sources 30, 32 and 34 symmetrically positioned on such disk. Each of the reed switches includes two electrical contacts which are closed by the magnets on first disk 27 when they are moved adjacent thereto.

A pulse processing circuit 35 having three inputs connected to switches 30, 32 and 34 responds to these swtich closures. The pulse processing circuit provides output signals to recorder 37 on a different one of two output terminals in response to an increment of rotation in a clockwise or counterclockwise direction. Although pulse processing circuit 35 is here shown to be an external unit, it is actually supported by stationary disk 29, on the side of disk 29 opposite reed switches 30, 32 and 34, thereby decreasing the size of the system.

As shown in FIG. 2, one switch contact of each of the reed switches 30, 32 and 34 is connected to ground, while the other switch contact of each of the reed switches is connected to a different one of three debounce circuits 36, 38 and 40. The outputs of the three debounce circuits are fed to three inputs of a rotation state detector stage 42.

When the liquid level is falling, so that float 18 moves downward, first disk 27 and shaft 26 rotate clockwise, as viewed in FIG. 1, closing the contacts of the first switch 30, the second switch 32 and the third switch 34 in the sequence named. When the water level is rising, so that float 18 moves upward, first disk 27 rotates in a counterclockwise direction. This causes the contacts of the third switch 34, the second switch 32 and the first switch 30 to be closed in the sequence named. Thus, it can be seen that the sequence in which the three switches are operated indicates whether the liquid level is going up or down from the previous level.

It should be noted that when the liquid level is falling, the switch closing sequence can, of course, be switches 32, 34 and 30 or switches 34, 30 and 32, as well as the above-described sequence of switches 30, 32 and 34. All three of these sequences indicate that first disk 27 is rotating in a clockwise direction and float 18 is falling. Similarly, when the liquid level is rising, the switch closing sequence can be switches 30, 34 and 32 or switches 32, 30 and 34, as well as the above-described sequences switches 34, 32 and 30, since all of these sequences indicate that the first disk 27 is rotating in a counterclockwise direction and the float is rising.

One complete rotation of first disk 27 defines twelve increments of liquid level change. There is an angle of 90° between each of the four magnets and 120° between each of the three switches. Therefore, there is a rotational interval of 30° between the output pulses from switches 30, 32 and 34. As a result, there are twelve switch closures and twelve pulses for each 360° rotation of first disk 27. In the preferred example, each measured increment of liquid level corresponds to a change of 0.01 foot. Since there are twelve increments possible for each complete revolution of first disk 27, one complete revolution of the disk corresponds to a change in liquid level of 0.12 foot.

Switch Debounce Circuits

A circuit diagram showing the shaft pulse generator switches and the pulse processing circuit 35 of one embodiment of the shaft position encoder apparatus of the present invention is shown in FIG. 2. The magnetic reed switches 30, 32 and 34 are connected to processing circuit 35 through switch debounce circuits 36, 38 and 40. Each such debounce circuit, for example, circuit 36, includes a pair of cascaded CMOS Schmitt trigger inverting amplifiers, or bistable multivibrators, 50 and 52. A Motorola MC145848, having six CMOS Schmitt trigger inverters, is used in the preferred embodiment. The output from reed switch 30 is capacitively coupled to the input of first inverter 50 through a capacitor 54. The input of inverter 50 is connected to a positive voltage source 56 of approximately 5 to 17 volts through a 820 kilohm pull-up resistor 58. The output of inverter 50 provides a debounced, inverted pulse signal which is fed to one input 70 of rotation state detector 42.

The output of the debounce circuit's first inverter 50 is further connected through a feedback loop comprising feedback inverter 52 and 120 kilohm feedback resistor 60. The output of inverter 50 is connected to the input of feedback inverter 52, and the output of feedback inverter 52 is fed through resistor 60 to the output of reed switch 30.

Normally, the input of inverter 50 is held at a logic high level by voltage supply 56 and pull-up resistor 58. The output of inverter 50 thus normally remains low. This logic low signal applied to the input of feedback inverter 52 causes output of feedback inverter 52 to normally remain high. This logic high signal, fed through resistor 60, normally holds the output of switch 30 high.

When switch 30 is momentarily activated by a magnet on first disk 27, the voltage on its output will momentarily be brought to zero. This logic low signal will be capacitively coupled to the input of inverter 50 through capacitor 54. The duration of the logic low signal on the input of inverter 50 is a function of the time constant set by capacitor 54 and resistor 58, and is further a function of the duration of the closure of reed switch 30. In normal operation, however, reed switch 30 will be closed for a comparatively long length of time, relative to the R-C time constant of resistor 58 and capacitor 54, and so the logic low level pulse on the input of inverter 50 will be solely a function of the R-C time constant. This momentary logic low signal having a duration of approximately 1 millisecond in the illustrated embodiment, causes the output of inverter 50 to rise to a logic high level for a corresponding period of time.

The outputs from switch debounce circuits 36, 38 and 40 are shown on lines a, b and c, respectively, of FIG. 3. Pulses 44, 46 and 48 are produced at the outputs of inverters 50 in response to the sequential closures of switches 30, 32 and 34. This sequence indicates clockwise shaft rotation, as described earlier. Pulses 48', 46' and 44' correspond to the sequential closures of switches 34, 32 and 30 and indicate counterclockwise rotation of shaft 26 and disk 27.

Rotation State Detector

Rotation state detector stage 42 comprises a type 4043B integrated circuit 62 and a type 4066B integrated circuit 64. Type 4043B integrated circuit 62 is a CMOS Quad NOR R/S Latch, or bistable circuit, but only three of the latch sections, 65, 66 and 68, are utilized. These three latch sections are configured as a rotation position detector and produce output detector pulses in response to encoder pulse signals from the switch debounce circuits.

The output from each of the switch debounce circuits 36, 38 and 40 is coupled to a Set input, S, of one of the latch sections 36, 38 and 40 and to a Reset input, R, of a different latch section. The output from the first switch debounce circuit 36 is fed to the Set input 70 of the first latch section 65 and is further fed to the Reset input 72 of the third latch section 68. The output from the second switch debounce circuit 38 is fed to the Set input 74 of the second latch section 66 and is further coupled to the Reset input 76 of the first latch section 65. The output of the third switch debounce circuit 40 is coupled to the Set input 78 of the third latch section 68 and is further coupled to the Reset input 80 of the second latch section 66. Thus, it can be seen that each time a logic high pulse is produced by any of the switch debounce circuits, one of the latch sections of integrated circuit 62 is "set" and a different one of the latch sections is "reset." When a latch section is "set," its output goes to a logic high level. When a section is "reset," its output goes to a logic low level.

In certain situations, one of reed switches 30, 32 and 34 may close two or more times in sequence, without the intervening closure of another switch. This may occur, for example, when the fluid level varies slightly around a certain level, but never enough to move the float the 0.01 foot required to close a second, different reed switch. Such multiple closures of a switch are not indicative of true changes in the fluid level and are to be ignored by the encoder system. Integrated circuit 62 provides a filtering function whereby repeated closures of one switch do not cause the output signals produced by the intergated circuit to change. Instead, the same latch sections are repeatedly "set" or "reset." This can be seen on lines c through f of FIG. 3, where pulse 48', following identical pulse 48, does not alter the output signals d, e and f from integrated circuit 62. These output signals only change when the shaft rotation is sufficient to close an adjacent switch.

Rotation state detector stage 42 also includes a CMOS Quad Bilateral Switch integrated circuit 64, of which three sections 88, 90 and 92 are used. Integrated circuit 64 acts as a rotation direction sensor, or decoder gate circuit, and controllably gates the output signals from the rotation position detector circuit 62 to an output circuit 94 in accordance with the direction of rotation, thereby decoding the pulse trains applied to inputs 70, 74 and 78. Outputs 82, 84 and 86 of integrated circuit 62 are fed to the three input terminals 96, 98 and 100 of the rotation direction sensor circuit 64, respectively. The signals present on input terminals 96, 98, and 100 of latch sections 88, 90 and 92 are gated to their output terminals 102, 104 and 106, respectively, when the corresponding control terminals (C) 108, 110 and 112 receive logic high pulses. Control terminal 108 of latch section 88 receives logic high pulses from the output of third switch debounce circuit 40. Control terminal 110 of latch section 90 receives logic high pulses from the output of first switch debounce circuit 36. Control terminal 112 of latch section 92 receives logic high pulses from the output of second switch debounce circuit 38. Outputs 102, 104 and 106 of integrated circuit 64 are connected together at a common roation direction sensor output 107 which drives output circuitry 94. Rotation direction sensor output 107 is coupled to ground through pull-down resistor 111 of 22 kilohms.

Each time one of the reed switches is closed, one of the bilateral switch sections 88, 90 and 92 of integrated circuit 64 momentarily gates the logic signal on its input to the output 107 of rotation state detector stage 42. As illustrated below, if the shaft is rotating in a clockwise direction, the signal being momentarily gated through integrated circuit 64 always comes from a section of integrated circuit 62 that was "reset" by the previous switch closure. Thus, when the shaft is rotating in a clockwise direction, momentary logic low signals, having a duration set by the debouncing circuits' time constants, will be repeatedly gated to rotation direction sensor output 107. Since output 107 is normally low, these repeated logic low signals gated to output 107 will not change its output voltage. If, however, the shaft rotation is in a counterclockwise direction, the signal being gated through integrated circuit 64 will come from a section of integrated circuit 62 that was "set" by the previous switch closure. A momentary logic high signal, having a duration set by the debouncing circuits' time constants, will thus be repeatedly gated to output 107 when the shaft is rotating in a counterclockwise direction.

The above sequence of events can best be seen by reference to lines d through j of FIG. 3. Lines d, e and f illustrate the voltages on outputs 82, 84 and 86, respectively, of integrated circuit 62, and lines g, h and i illustrate the voltages on outputs 102, 104 and 106, respectively, of integrated circuit 64. Line j illustrates the voltage on rotation direction sensor output 107, which is simply the signals on outputs 102, 104 and 106 "OR"ed together.

During clockwise rotation, as shown in the left side of FIG. 3, output 107 remains at a logic low level. For example, when switch 30 is closed, producing pulse 44, output 82 of integrated circuit 62 goes high and output 86 goes low (lines d, f). When switch 32 is subsequently closed, producing pulse 46, output 84 of integrated circuit 62 goes high and output 82 goes low (lines e, d). The closure of switch 32 also gates the signal on output 86 of integrated circuit 62 to output 106 of integrated circuit 64 and output 107 of rotation state detector 42 (lines i, j). This output signal is at a logic low level since output 86 of integrated circuit 62 was just reset by the previous switch closure (switch 30). Similarly, whenever the reed switches are activated in a clockwise manner, the signal gated to output 107 will always be low, since it originated at the output of a section of integrated circuit 62 that was "reset" by the previous switch closure.

Correspondingly, during counterclockwise rotation, as shown in the right side of FIG. 3, output 107 (line j) has a logic high level output pulse corresponding to each increment of counterclockwise shaft rotation. For example, when switch 34 is closed, producing pulse 48', output 86 remains high and output 84 remains low (lines f, e). (Since pulse 48' followed identical pulse 48 without the closure of any intervening switches, these outputs merely maintained their previously "set" and "reset" levels.) When switch 32 is subsequently closed, producing pulse 46', output 84 is "set" high and output 82 is "reset" low (lines e, d). The closure of switch 32 also gates the signal on output 86 of integrated circuit 62 to output 106 of integrated circuit 64 and output 107 of rotation state detector 42 (lines i, j). This output signal is a logic high level pulse, since output 86 was just "set" by the previous switch closure (switch 34). Similarly, whenever the switches are activated in a counteclockwise manner, the signal gated to output 107 will always be a logic high pulse, since it originated at the output of a section of integrated circuit 62 that was "set" by the previous switch closure. Thus, the logic level of output 107 of rotation direction sensor circuit 64 indicates whether the shaft rotation is in a clockwise or counterclockwise direction.

Rotation Detector

The detection of increments of shaft rotation, as opposed to a single switch being repeatedly closed, is effected by rotation detector 109, which is comprised of a type 4063B integrated circuit 110 operating on the output signals from integrated circuit 62.

Integrated circuit 110 of rotation detector 109 is a 4 Bit Magnitude Comparator which acts as a monostable pulse generator to produce a logic low-level output signal at output 118 when two three-bit words applied to the two inputs of each of its comparator sections are not equal. (In the present embodiment, only three of the four sections are used.) One three-bit word is applied to one input of the sections directly from the outputs 82, 84 or 86 of integrated circuit 62. The second three-bit word from the same outputs is coupled to the other input of the section through one of three pulse integration circuits 113, 114 and 116. Regardless of the logic levels on the outpus of integrated circuit 62, the two three-bit words being compared by integrated circuit 110 will be equal, provided the time delays introduced by the three R-C delays of the pulse integration circuits have lapsed. The output from integrated circuit 110 will thus be normally positive. When, however, an output of integrated circuit 62 changes, the changed value will appear immediately on the directly coupled input, but the delayed input will still retain the previously-applied logic level. Thus, for a time determined by the R-C time constant of that integration circuit, the two three-bit words compared by integrated circuit 110 will not be equal, and the output 118 of integrated circuit 110 will momentarily drop to a logic low level. These momentray logic low pulses from rotation pulse generator output 118 are shown on line k of FIG. 3 and indicate incremental rotations of the shaft.

The R-C delay circuits 113, 114 and 116 on the inputs of integrated circuit 110 are chosen to produce pulses of output terminal 118 having a duration of approximately ten microseconds. In the illustrated embodiment, however, these R-C circuits are not identical, due to idiosyncrasies of type 4063B integrated circuits. AT very low temperatures, about −40° C., it was discovered that the output signal on terminal 118 would "jitter" when two bits of a word were changed simultaneously. In this application, changes always occur by twos since one bit is being "set" to a logic high level while the other bit is being "reset" to a logic low level.

The "jitter" problem was overcome by providing slightly different R-C time constants on the input of each bit comprising the delayed word. The three shunt capacitors 120, 122 and 124 of integration circuits 113, 114 and 116, respectively, each have a value of 100 picofarads. The coupling resistors, however, all have different values. Resistor 126 of delay circuit 113 has a value of 9.1 kilohms; resistor 128 of delay circuit 114 has a value of 4.7 kilohms; and resistor 130 of delay circuit 116 has a value of 6.8 kilohms.

Output Circuitry

Output circuitry 94 combines the direction-of-rotation information provided at output 107 by rotation direction sensro 64 and the unit-of-rotation information provided at output 118 by rotation detector 109 to produce one of two output signals indicative of an incemental shaft rotation in a clockwise or counterclockwise direction. If an increment of counterclockwise shaft rotation is sensed, a thirty millisecond logic low level output pulse is provided on an output line 150. If an increment of clockwise shaft rotation is sensed, a thirty millisecond logic low level output pulse is provided on a second output line 152.

The thirty millisecond pulse periods were chosen to interface properly with the particular data recording or transmitting equipment connected to the output circuitry. Other recording or transmitting equipment may require different pulse periods, such as one millisecond, for proper operation. Such other pulse periods can easily be achieved by varying the timing components, as described below. Accordingly, although lines n and o of FIG. 3 show thirty millisecond output pulses, it should be recognized that these pulses may be of any duration, as indicated by the particular recording or transmitting equipment being signaled.

The signal from output 107 of rotation state detector 42, indicating the direction of shaft rotation, is applied to a first input 154 of output circuit 94. The output 118 of rotation detector 109, indicating increments of shaft rotation, is applied to a second input 156 of output circuit 94.

In the illustrated embodiment, output circut 94 includes a rotation direction indicating circuit 95 comprised of four NAND gates 158, 162, 166 and 172. These NAND gates are preferably CMOS Schmitt trigger gates, such as the CD4093 type integrated circuit. One NAND gate 158 is configured as an inverter, having its two inputs tied together. NAND gate 158 inverts the output signal provided on output 118 of rotation pulse generator 109 and provides the inverted signal to input 160 of NAND gate 162 and to input 164 of NAND gate 166. The other inputs of NAND gates 162 and 166 are coupled to the output 107 of rotation state detector 42. Input 168 of NAND gate 162 is coupled directly to output 107 of rotation state detector 42. Input 170 of NAND gate 166, however, is coupled to output 107 through a fourth NAND gate 172 configured as an inverter, with one of its inputs tied to voltage supply 56 and the other input connected to the output 107.

The output of one of NAND gates 162 and 166 will fall to logic low each time rotation detector 109 produces an output pulse. The output of NAND gate 162 will fall low if the direction of rotation is counterclockwise, as shown in line 1 of FIG. 3. The output of NAND gate 166 will fall low if the direction of rotation is clockwise, as shown in line m of FIG. 3. The outputs of NAND gates 162 and 166 serve to trigger two monostable circuits 180 and 182. Monostable circuits 180 and 182 comprise a type 14538B CMOS integrated circuit. The values of the timing components 184, 186, 188 and 190 are chosen to generate a direction-indicating output signal pulse having a duration of approximately thirty milliseconds. Resistors 184 and 186 have a value of 330 kilohms. (Resistors 184 and 186 should have a value of ten kilohms if a one millisecond output pulse is required.) Capacitors 188 and 190 have a value of 0.1 microfarad. The pulses from monostables 180 and 182 are fed through 12 kilohm resistors 192 and 194 to the bases of two type 2N4124 driver transistors 196 and 198, respectively, which provide these output pulses to output terminals 150 and 152. The resultant output pulses are shown in lines n and o of FIG. 3.

A thirty millisecond (or one millisecond) pulse on output 150 indicates a unit of counterclockwise shaft rotation, corresponding to a 0.01 foot rise in fluid level. A thirty millisecond (or one millisecond) pulse on output 152 indicates a unit of clockwise shaft rotation, or a 0.01 foot fall in fluid level. These signals may be provided to a data recorder 37 for one-site collection of fluid level data, or they may be transmitted by radio or telephone lines to a central data collection site. The low power consumption of the apparatus, nominally sixty microwatts, facilitates remote, battery-powered operation of the unit with solar energy.

It will be obvious to those having ordinary skill in the art that many changes may be made in the details of the above-described preferred embodiment of the present invention without departing from the spirit of the invention. Therefore, the scope of the present invention should only be determined by the following claims.

What is claimed is:
1. Shaft position encoder apparatus, comprising:
input means including a plurality of pulse sources spaced about the axis of a shaft, for producing by said sources a group of encoder pulses for each measured change in the revolution of said shaft, with the sequence of the pulses corresponding to the direction of rotation of said shaft;

rotation position detector means for detecting the rotational position of the shaft connected to the pulse terminals of said input means, and for producing detector output pulses at detector output terminals corresonding to said pulse terminals in response to receipt of said encoder pulses;

rotation direction sensor means for determining the direction of rotation of said shaft having a plurality of stages whose inputs are connected to different detector output terminals of said rotation position detector means, and having a common output connected to the outputs of said stages to produce an output signal indicating the direction of rotation of said shaft;

rotation detector means for producing an output pulse when said shaft is rotating by detecting changes in the voltage level of the detector output terminals of said rotation position detector means; and output means for producing two output indicator signals indicating the two opposite directions of rotation of the shaft and the position of the shaft in response to the output signal of said rotation direction sensor means and the output pulse of said rotation detection means.

2. An encoder apparatus in accordance with claim 1 in which the input means includes three magnetically actuated switches which form three pulse sources.

3. An encoder apparatus in accordance with claim 2 in which each switch is connected to a switch contact debounce circuit including an inverter amplifier having its input connected through a coupling capacitor to said switch and having a feedback circuit connected from the output to the input of said amplifier through said capacitor.

4. An encoder apparatus in accordance with claim 3 in which the feedback circuit includes a inverting bistable multivibrator having its input connected to the output of said amplifier and having its output connected through a feedback resistance to said coupling capacitor.

5. An encoder apparatus in accordance with claim 2 in which the input means includes a plurality of magnets mounted for rotation with said shaft and uniformly spaced about the axis of the shaft so that each switch produces a group of pulses equal in number to the number of said magnets for each revolution of the said shaft.

6. An encoder apparatus in accordance with claim 1 in which the rotation detector means has a plurality of comparator circuits each having two inputs connected to one of the output terminals of said rotation position detector means with one input connected directly to the detector output, and a second input connected through a coupling resistance to said detector output and a shunt capacitor connected between said second input and ground for integration of the output pulse applied to said one input.

7. An encoder apparatus in accordance with claim 1 in which output means comprises a rotation direction indicator circuit including a first NAND gate connected at one input to the first input of said indicator circuit, a second NAND gate connected at one input to the second input of said indicator circuit and connected at its other input to said first input, and a third NAND gate having one input connected to the output of said first gate and having another input connected to said second input.

8. An encoder apparatus in accordance with claim 1 in which the rotation position detector means includes a bistable circuit with a plurality of bistable stages, each having a set input connected to a different one of said pulse terminals of the input means and a reset input connected to another of said pulse terminals.

9. An encoder apparatus in accordance with claim 1 in which the rotation direction sensor means includes a decoder gate circuit with a plurality of gate stages, each having an input connected to one of the rotation position detector means output terminals and having a control terminal connected to one of the pulse terminals of the input means.

10. Shaft position encoder apparatus, comprising:
input means including at least three pulse sources spaced about the axis of a shaft, for producing by said sources a group of encoder pulses for each measured change in the revolution of said shaft, with the sequence of the pulses corresponding to the direction of rotation of said shaft;

rotation position detector means for detecting the rotational position of the shaft, including a bistable circuit with three bistable stages each having a set input connected to a different one of said three pulse terminals and a reset input connected to another of said three pulse terminals, for producing a detector output pulse at the detector output of each stage when the stage is triggered by an input pulse applied to its set input after said stage is reset;

rotation direction sensor means for determining the direction of rotation of said shaft, including decoder gate circuit with three gate stages each having an input connected to the detector output terminal of one of said three bistable stages, having a control terminal connected to one of said three pulse terminals. and having a common output connected to the output terminals of each of said gate stages so that an output signal produced at said common output indicates the direction of rotation of said shaft;

rotation detector means for detecting when said shaft is rotating, including a monostable pulse generator with three differential comparator sections each having a first input directly connected to the detector output of a different bistable stage of said three bistable stages and having a second input connected through a pulse integration circuit to the same detecotr output connected to said first input, said comparator stages each comparing the voltage levels on its first and second inputs for each detector output pulse on said same detector output of said bistable stage and switching to produce an output pulse at the output of said pulse generator when said voltage levels are sufficiently different due to rotation of the shaft; and output means for producing two output indicator signals indicating the two opposite directions of rotation of the shaft and the position of the shaft, including a rotation direction indicator circuit having a first input connected to the common output of said decoder gate circuit and a second input connected to the output of said monostable pulse generator and which transmits a first direction signal to a first output and a second direction signal to a second output corresponding, respectively, to the two opposite directions of rotation of the shaft.

11. An encoder apparatus in accordance with claim 10 in which the input means includes three magnetically actuated switches which form said three pulse sources.

12. An encoder apparatus in accordance with claim 11 in which each switch is connected to a switch contact debounce circuit including an inverter amplifier having its input connected through a coupling capacitor to said switch and having a feedback circuit connected from the output to the input of said amplifier through said capacitor.

13. An encoder apparatus in accordance with claim 12 in which the feedback circuit includes an inverting bistable multivibrator having its input connected to the output of said amplifier and having its output connected through a feedback resistance to said coupling capacitor.

14. An encoder apparatus in accordance with claim 11 in which the input means includes a plurality of magnets mounted for rotation with said shaft and uniformly spaced about the axis of the shaft so that each switch produces a group of pulses equal in number to the number of said magnets for each revolution of the said shaft.

15. An encoder apparatus in accordance with claim 10 in which the pulse integration circuits of the rotation detector means each include a coupling resistance connected between the second input and the detector output of the bistable stage of the rotation position detector means, and a shunt capacitance connected between said second input and ground.

16. An encoder apparatus in accordance with claim 10 in which the rotation direction indicator circuit of the output means includes a first NAND gate connected at one input to the first input of said indicator circuit, a second NAND gate connected at one input to the second input of said indicator circuit and connected at its other input to said first input, and a third NAND gate having one input connected to the output of said first gate and having another input connected to said second input, said first direction signal being produced at the output of said third gate and said second direction signal being produced at the output of said second gate.

* * * * *